(12) United States Patent
Shibata et al.

(10) Patent No.: US 11,461,524 B2
(45) Date of Patent: Oct. 4, 2022

(54) INFORMATION PROCESSING APPARATUS AND CONFIGURATION METHOD

(71) Applicant: Ricoh Company, Ltd., Tokyo (JP)

(72) Inventors: Takayuki Shibata, Kanagawa (JP); Yuichi Sakurada, Tokyo (JP); Tatsuya Ishii, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 122 days.

(21) Appl. No.: 17/063,849

(22) Filed: Oct. 6, 2020

(65) Prior Publication Data

US 2021/0150113 A1 May 20, 2021

(30) Foreign Application Priority Data

Nov. 20, 2019 (JP) .............................. JP2019-209910

(51) Int. Cl.
  *G06F 30/34* (2020.01)
  *H03K 19/17736* (2020.01)
  *G06F 15/78* (2006.01)

(52) U.S. Cl.
  CPC .......... *G06F 30/34* (2020.01); *G06F 15/7867* (2013.01); *H03K 19/17736* (2013.01)

(58) Field of Classification Search
  CPC .. G06F 30/34; G06F 15/7867; G06F 15/7871; H03K 19/17736
  USPC ........................................................ 326/41
  See application file for complete search history.

(56) References Cited

U.S. PATENT DOCUMENTS

| | | | | |
|---|---|---|---|---|
| 5,493,239 | A  * | 2/1996 | Zlotnick ................. | G06F 30/34 326/38 |
| 5,760,607 | A  * | 6/1998 | Leeds ............... | H03K 19/17758 326/38 |
| 6,198,303 | B1 * | 3/2001 | Rangasayee ......... | H03K 19/177 326/38 |
| 6,347,346 | B1 * | 2/2002 | Taylor ................ | H03K 19/1776 710/22 |
| 6,614,259 | B2 * | 9/2003 | Couts-Martin .. | H03K 19/17704 326/46 |
| 6,847,227 | B2 * | 1/2005 | Goldfinch ................ | G06F 30/34 326/38 |
| 6,898,101 | B1 * | 5/2005 | Mann ................... | G06F 15/7867 365/51 |
| 7,320,064 | B2 * | 1/2008 | Ramos ................ | G06F 13/4217 712/15 |

(Continued)

FOREIGN PATENT DOCUMENTS

| | | |
|---|---|---|
| JP | 2003-058385 | 2/2003 |
| JP | 2004-343158 | 12/2004 |

(Continued)

*Primary Examiner* — Don P Le
(74) *Attorney, Agent, or Firm* — Xsensus LLP

(57) ABSTRACT

An information processing apparatus includes a central processing unit (CPU), a plurality of field-programmable gate arrays (FPGAs) connected to the CPU to communicate with the CPU, and a plurality of memories provided in a one-to-one relationship with the plurality of FPGAs. Each of the plurality of memories is configured to store configuration data of a corresponding one of the plurality of FPGAs. One of the plurality of FPGAs is configured to update the configuration data of each of the plurality of FPGAs stored in a corresponding one of the plurality of memories.

10 Claims, 6 Drawing Sheets

(56) References Cited

U.S. PATENT DOCUMENTS

| | | | |
|---|---|---|---|
| 7,538,577 B2* | 5/2009 | Bollinger | H03K 19/17744 |
| | | | 326/38 |
| 7,589,558 B1* | 9/2009 | Tseng | G06F 30/34 |
| | | | 326/41 |
| 2016/0197615 A1* | 7/2016 | Oda | H03K 19/1776 |
| | | | 326/41 |
| 2018/0157617 A1 | 6/2018 | Shibata et al. | |

FOREIGN PATENT DOCUMENTS

| | | |
|---|---|---|
| JP | 2011-173382 | 9/2011 |
| JP | 2013-038741 | 2/2013 |
| JP | 2014-081825 | 5/2014 |
| JP | 2015-032109 | 2/2015 |
| JP | 2018-005762 | 1/2018 |
| JP | 2018-092488 | 6/2018 |

* cited by examiner

FIG. 2

| FPGA | EXISTENCE OF UPDATE PROCESSING UNIT | CONFIGURATION DATA STORED IN CORRESPONDING PROM ||
|---|---|---|---|
| | | FOR UPDATING | FOR NORMAL STARTUP |
| FPGA_1 | PRESENT | PRESENT | PRESENT |
| FPGA_2 | ABSENT | ABSENT | PRESENT |
| FPGA_3 | ABSENT | ABSENT | PRESENT |

FIG. 7

| SELECTOR | STATE |
|---|---|
| 141 | CONNECTED |
| 142 | CONNECTED |
| 143 | CONNECTED |
| 144 | DISCONNECTED |
| 145 | DISCONNECTED |

FIG. 8

| SELECTOR | STATE |
|---|---|
| 141 | CONNECTED |
| 142 | DON'T CARE |
| 143 | DON'T CARE |
| 144 | DISCONNECTED |
| 145 | DISCONNECTED |

FIG. 9

| SELECTOR | STATE |
|---|---|
| 141 | DISCONNECTED |
| 142 | DISCONNECTED |
| 143 | DON'T CARE |
| 144 | CONNECTED |
| 145 | DISCONNECTED |

FIG. 10

| SELECTOR | STATE |
|---|---|
| 141 | DISCONNECTED |
| 142 | DON'T CARE |
| 143 | DISCONNECTED |
| 144 | DISCONNECTED |
| 145 | CONNECTED |

# INFORMATION PROCESSING APPARATUS AND CONFIGURATION METHOD

CROSS-REFERENCE TO RELATED APPLICATION

This patent application is based on and claims priority pursuant to 35 U.S.C. § 119(a) to Japanese Patent Application No. 2019-209910, filed on Nov. 20, 2019, in the Japan Patent Office, the entire disclosure of which is hereby incorporated by reference herein.

BACKGROUND

Technical Field

Embodiments of the present disclosure relate to an information processing apparatus and a configuration method.

Related Art

Typically, in information processing apparatuses such as image forming apparatuses, a technique has been used in which a central processing unit (CPU) causes a field programmable gate array (FPGA) to execute a specific function to reduce the load on the CPU.

The FPGA reads configuration data customized for the FPGA from a predetermined memory and performs configuration with the read, customized configuration data (i.e., writing of the read, customized configuration data) to execute the specific function.

SUMMARY

In one embodiment of the present disclosure, a novel information processing apparatus includes a central processing unit (CPU), a plurality of field-programmable gate arrays (FPGAs) connected to the CPU to communicate with the CPU, and a plurality of memories provided in a one-to-one relationship with the plurality of FPGAs. Each of the plurality of memories is configured to store configuration data of a corresponding one of the plurality of FPGAs. One of the plurality of FPGAs is configured to update the configuration data of each of the plurality of FPGAs stored in a corresponding one of the plurality of memories.

Also described is a novel configuration method for the information processing apparatus.

BRIEF DESCRIPTION OF THE DRAWINGS

A more complete appreciation of the embodiments and many of the attendant advantages and features thereof can be readily obtained and understood from the following detailed description with reference to the accompanying drawings, wherein:

FIG. 2 is a diagram illustrating a processing circuit included in an information processing apparatus and a list of data, according to an embodiment of the present disclosure;

FIG. 7 is a diagram illustrating the states of selectors upon normal startup, according to an embodiment of the present disclosure;

FIG. 8 is a diagram illustrating the states of selectors when the configuration data of the first FPGA is to be updated, according to an embodiment of the present disclosure;

FIG. 9 is a diagram illustrating the states of selectors when the configuration data of a second FPGA is to be updated, according to an embodiment of the present disclosure; and FIG. 10 is a diagram illustrating the states of selectors when the configuration data of a third FPGA is to be updated, according to an embodiment of the present disclosure.

The accompanying drawings are intended to depict embodiments of the present disclosure and should not be interpreted to limit the scope thereof. Also, identical or similar reference numerals designate identical or similar components throughout the several views.

DETAILED DESCRIPTION

Figure 1:
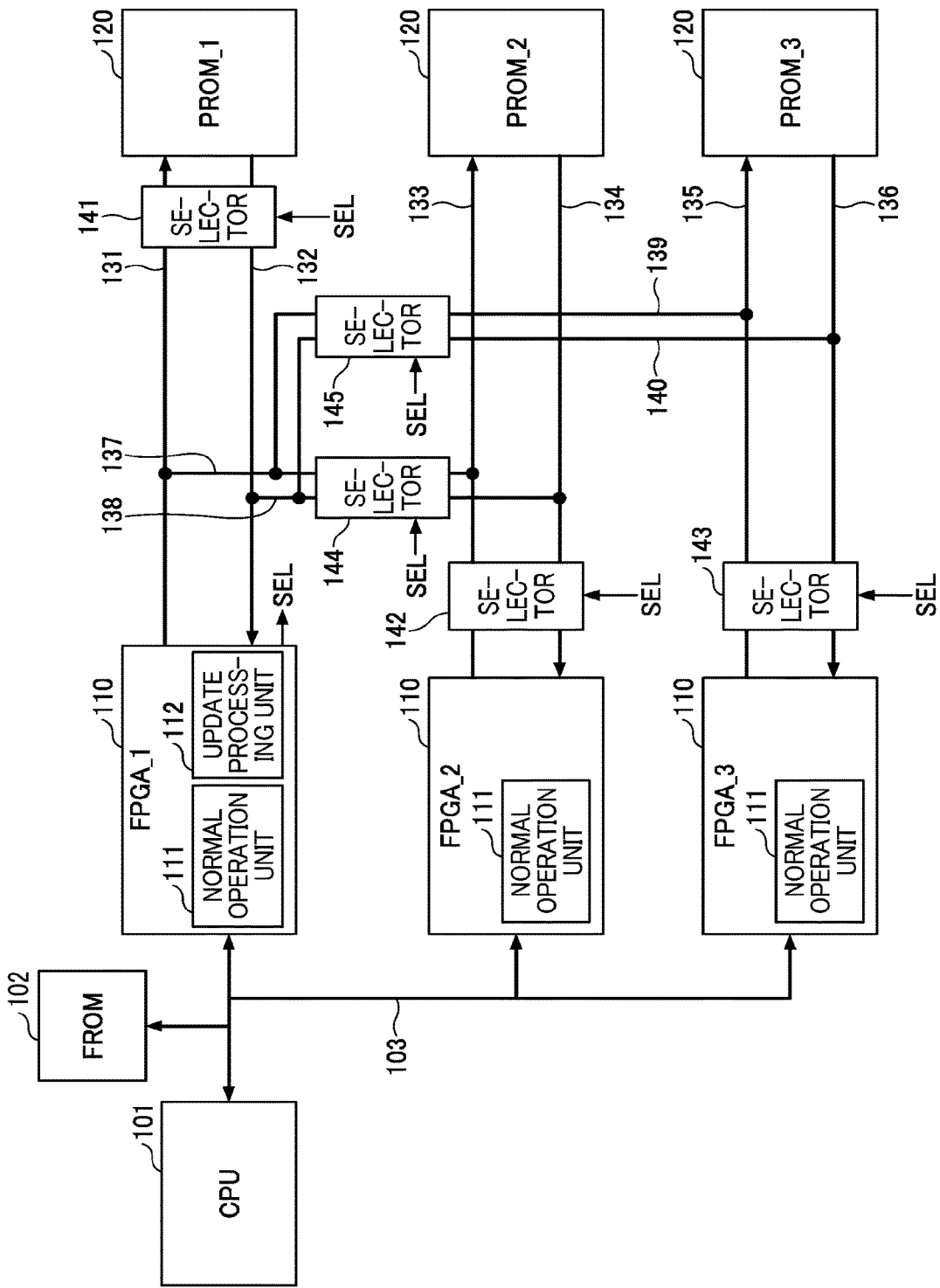
FIG. 1 is a diagram illustrating a system configuration of an information processing apparatus, according to an embodiment of the present disclosure.

In describing embodiments illustrated in the drawings, specific terminology is employed for the sake of clarity. However, the disclosure of the present specification is not intended to be limited to the specific terminology so selected and it is to be understood that each specific element includes all technical equivalents that have a similar function, operate in a similar manner, and achieve a similar result.

Although the embodiments are described with technical limitations with reference to the attached drawings, such description is not intended to limit the scope of the disclosure and not all of the components or elements described in the embodiments of the present disclosure are indispensable to the present disclosure.

In a later-described comparative example, embodiment, and exemplary variation, for the sake of simplicity, like reference numerals are given to identical or corresponding constituent elements such as parts and materials having the same functions, and redundant descriptions thereof are omitted unless otherwise required.

As used herein, the singular forms "a," "an," and "the" are intended to include the plural forms as well, unless the context clearly indicates otherwise.

Referring to the drawings, wherein like reference numerals designate identical or corresponding parts throughout the several views, embodiments of the present disclosure are described below.

Initially with reference to FIG. 1, a description is given of an outline of a system of an information processing apparatus 10.

FIG. 1 is a diagram illustrating a system configuration of the information processing apparatus 10, according to an embodiment of the present disclosure.

In the present embodiment, the information processing apparatus 10 includes three field programmable gate arrays (FPGAs) as an example of "a plurality of FPGAs." However, the embodiments of the present disclosure are not limited to the three FPGAs. The embodiments are also applicable to an information processing apparatus that includes two or not less than four FPGAs.

The information processing apparatus 10 illustrated in FIG. 1 includes a central processing unit (CPU) 101 and a plurality of FPGAs 110, which include a first FPGA 110, a second FPGA 110, and a third FPGA 110. Hereinafter, the first FPGA 110, the second FPGA 110, and the third FPGA 110 are referred to as FPGA_1, FPGA_2, and FPGA_3, respectively. The information processing apparatus 10 executes a specific function with the FPGAs 110 to reduce the load on the CPU 101.

When various kinds of controls such as an image forming control, a fixing control, and a conveyance control are performed as in, e.g., the engine control of an image forming apparatus, the FPGAs 110 may execute arithmetic processing (e.g., image position correction control and color unevenness correction processing) that increases the load on the CPU 101, so as to reduce the load on the CPU 101.

Each of the FPGAs 110 reads configuration data customized for each of the FPGA 110 from a memory and starts up, so as to be ready for use.

As illustrated in FIG. 1, the information processing apparatus 10 of the present embodiment stores the configuration data of the FPGA_1, the configuration data of the FPGA_2, and the configuration data of the FPGA_3 in a first programmable read only memory (PROM) 120, a second PROM 120, and a third PROM 120, respectively. Hereinafter, the first PROM 120, the second PROM 120, and the third PROM 120 are referred to as PROM_1, PROM_2, and PROM_3, respectively. Such a configuration in the information processing apparatus 10 of the present embodiment allows the FPGA_1, the FPGA_2, and the FPGA_3 to read the configuration data and start up in parallel with each other. Accordingly, the information processing apparatus 10 of the present embodiment shortens the startup time of the FPGAs 110.

With continued reference to FIG. 1, a detailed description is now given of a system configuration of the information processing apparatus 10.

As illustrated in FIG. 1, the information processing apparatus 10 includes the CPU 101, a flash read only memory (FROM) 102, the FPGAs 110 (i.e., the FPGA_1, the FPGA_2, and the FPGA_3), and a parallel bus 103.

The CPU 101 controls an entire system. For example, the CPU 101 executes a program stored in the FROM 102 and controls the FPGA_1, the FPGA_2, and the FPGA_3 via the parallel bus 103. The FROM 102 stores programs that the CPU 101 executes.

Now, a description is given of the plurality of FPGAs 110.

Each of the FPGAs 110 (i.e., the FPGA_1, the FPGA_2, and the FPGA_3) executes a specific function of the information processing apparatus 10. Each of the FPGAs 110 is connected to the CPU 101 via the parallel bus 103 such that each of the FPGAs 110 can communicate with the CPU 101. As the configuration data is written to each of the FPGAs 110, each of the FPGAs 110 may serve as a logic circuit to execute the specific function of the information processing apparatus 10.

Each of the FPGAs 110 includes a normal operation unit 111. The normal operation unit 111 is a processing circuit that operates upon normal startup of the FPGAs 110.

The FPGA_1 of the FPGAs 110 includes an update processing unit 112. The update processing unit 112 is a processing circuit that updates the configuration data of the FPGAs 110 (i.e., the configuration data of the FPGA_1, the configuration data of the FPGA_2, and the configuration data of the FPGA_3) stored in below-described PROMs 120 (namely, the PROM_1, the PROM_2, and the PROM_3), respectively.

Now, a description is given of the PROM_1, the PROM_2, and the PROM_3.

The information processing apparatus 10 includes the PROMs 120 (i.e., the PROM_1, the PROM_2, and the PROM_3) that correspond to the FPGA_1, the FPGA_2, and the FPGA_3, respectively, in a one-to-one relationship. The PROM_1, the PROM_2, and the PROM_3 store the configuration data of the FPGA_1, the configuration data of the FPGA_2, and the configuration data of the FPGA_3, respectively.

Now, a description is given of serial buses 131 to 136.

The PROM_1 is connected to the FPGA_1 via the serial buses 131 and 132. The PROM_1 stores the configuration data of the FPGA_1. The serial bus 131 serves as a communication path through which the FPGA_1 transmits a communication command and the configuration data to the PROM_1. The serial bus 132 serves as a communication path through which the PROM_1 transmits, e.g., a response to the communication command and the configuration data to the FPGA_1.

The PROM_2 is connected to the FPGA_2 via the serial buses 133 and 134. The PROM_2 stores the configuration data of the FPGA_2. The serial bus 133 serves as a communication path through which the FPGA_2 transmits a communication command to the PROM_2. The serial bus 134 serves as a communication path through which the PROM_2 transmits, e.g., a response to the communication command and the configuration data to the FPGA_2.

The PROM_3 is connected to the FPGA_3 via the serial buses 135 and 136. The PROM_3 stores the configuration data of the FPGA_3. The serial bus 135 serves as a communication path through which the FPGA_3 transmits a communication command to the PROM_3. The serial bus 136 serves as a communication path through which the PROM_3 transmits, e.g., a response to the communication command and the configuration data to the FPGA_3.

Now, a description is given of serial buses 137 to 140.

The serial buses 131 and 132 are connected to the serial buses 133 and 134 via the serial buses 137 and 138, respectively.

The serial bus 137 serves as a communication path through which the FPGA_1 transmits a communication command and the configuration data to the PROM_2 when the update processing unit 112 of the FPGA_1 updates the configuration data of the FPGA_2 stored in the PROM_2.

The serial bus 138 serves as a communication path through which the PROM_2 transmits a response to the communication command to the FPGA_1 when the update processing unit 112 of the FPGA_1 updates the configuration data of the FPGA_2 stored in the PROM_2.

The serial buses 131 and 132 are connected to the serial buses 135 and 136 via the serial buses 139 and 140, respectively.

The serial bus 139 serves as a communication path through which the FPGA_1 transmits a communication command and the configuration data to the PROM_3 when the update processing unit 112 of the FPGA_1 updates the configuration data of the FPGA_7 in the PROM_3.

The serial bus 140 serves as a communication path through which the PROM_3 transmits a response to the communication command to the FPGA_1 when the update processing unit 112 of the FPGA_1 updates the configuration data of the FPGA_3 stored in the PROM_3.

Now, a description is given of selectors 141 to 145.

The information processing apparatus 10 includes the selectors 141 to 145 as an example of "switchers." The selector 141 is provided on the serial buses 131 and 132. The selector 141 selectively switches the serial buses 131 and 132 between a connected state and a disconnected state.

The selector 142 is provided on the serial buses 133 and 134. The selector 142 selectively switches the serial buses 133 and 134 between the connected state and the disconnected state.

The selector 143 is provided on the serial buses 135 and 136. The selector 143 selectively switches the serial buses 135 and 136 between the connected state and the disconnected state.

The selector 144 is provided on the serial buses 137 and 138. The selector 144 selectively switches the serial buses 137 and 138 between the connected state and the disconnected state.

The selector 145 is provided on the serial buses 139 and 140. The selector 145 selectively switches the serial buses 139 and 140 between the connected state and the disconnected state.

The switching of each of the selectors 141 to 145 is controlled by a switching signal SEL transmitted from the FPGA_1.

In the information processing apparatus 10 having a configuration described above, the CPU 101 performs initial setting and gives operation instructions on each of the FPGA_1, the FPGA_2, and the FPGA_3 via the parallel bus 103 upon normal operation. In the FPGA_1, the FPGA_2, and the FPGA_3, the individual normal operation units 111 read the configuration data from the PROM_1, the PROM_2, and the PROM_3, respectively, to start up the corresponding FPGAs.

On the other hand, in the information processing apparatus 10 having the configuration described above, the CPU 101 transmits updated data of the configuration data of each of the FPGA_1, the FPGA_2, and the FPGA_3 to the FPGA_1 via the parallel bus 103 when the configuration data is to be updated.

The FPGA_1 switches the selector 141 to the "connected state" and stores the updated data for the FPGA_1 in the PROM_1 via the serial bus 131.

The FPGA_1 switches the selector 144 to the "connected state" and stores the updated data for the FPGA_2 in the PROM_2 via the serial buses 131, 137, and 133.

The FPGA_1 switches the selector 145 to the "connected state" and stores the updated data for the FPGA_3 in the PROM_3 via the serial buses 131, 139, and 135.

Referring now to FIG. 2, a description is given of a processing circuit included in the information processing apparatus 10 described above and a list of data.

FIG. 2 is a diagram illustrating a processing circuit included in the information processing apparatus 10 and a list of data, according to an embodiment of the present disclosure.

Typically, in order to allow the configuration data of each of FPGAs to be updated so as to deal with a specification change, each of the FPGAs includes an update processing unit that is configured to update the configuration data stored in a corresponding one of PROMs provided in a one-to-one relationship with the FPGAs. Such a configuration increases the circuit scale of each of the FPGAs.

By contrast, in the information processing apparatus 10 of the present embodiment, the FPGA_1 alone includes the update processing unit 112 as illustrated in FIG. 2. With such a configuration, the information processing apparatus 10 of the present embodiment reduces the circuit scale of the other FPGAs, namely, the FPGA_2 and the FPGA_3.

In addition, as illustrated in FIG. 2, in the information processing apparatus 10 of the present embodiment, the PROM_1, corresponding to the FPGA_1, alone stores update configuration data that is used for updating. With such a configuration, the information processing apparatus 10 of the present embodiment reduces the memory usage of the other PROMs, namely, the PROM_2 and the PROM_3.

Figure 3:
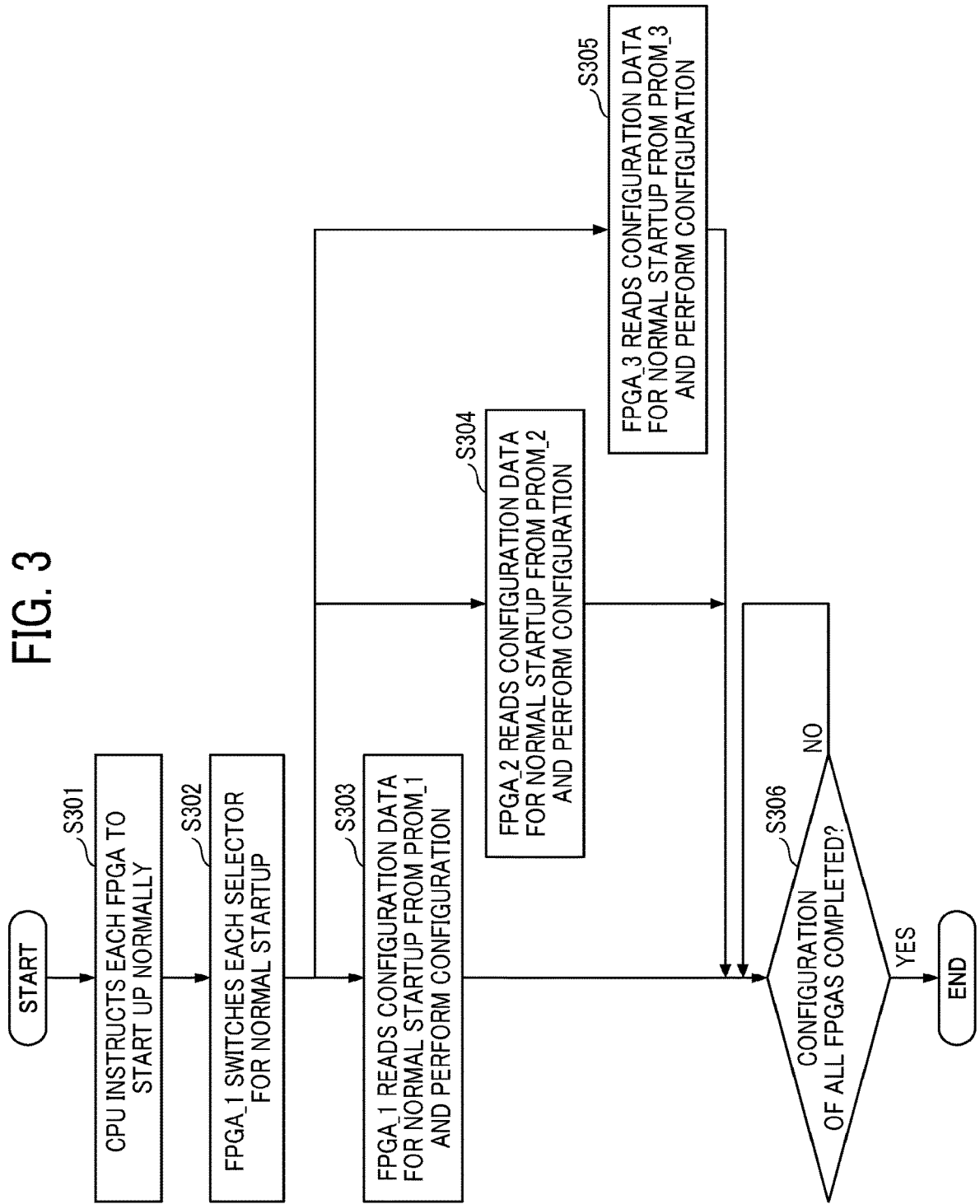
FIG. 3 is a flowchart of a normal startup process that is performed by an information processing apparatus, according to an embodiment of the present disclosure.

Referring now to FIG. 3, a description is given of a procedure taken by the information processing apparatus 10 to carry out a normal startup process. FIG. 3 is a flowchart of the normal startup process that is performed by the information processing apparatus 10, according to an embodiment of the present disclosure.

Firstly, in step S301, the CPU 101 instructs, via the parallel bus 103, each of the FPGA_1, the FPGA_2, and the FPGA_3 to start up normally.

Subsequently, in step S302, the FPGA_1 switches each of the selectors 141 to 145 for normal startup as illustrated in FIG. 7. As a consequence, the FPGA_1, the FPGA_2, and the FPGA_3 are connected to the PROM_1, the PROM_2, and the PROM_3, respectively, such that the FPGA_1, the FPGA_2, and the FPGA_3 can communicate with the PROM_1, the PROM_2, and the PROM_3, respectively.

Subsequently, in step S303, the normal operation unit 111 of the FPGA_1 reads configuration data for normal startup from the PROM_1 via the serial bus 132, and performs configuration with the read configuration data for normal startup (i.e., writing of the read configuration data for normal startup).

At the same time, in step S304, the normal operation unit 111 of the FPGA_2 reads configuration data for normal startup from the PROM_2 via the serial bus 134, and performs configuration with the read configuration data for normal startup (i.e., writing of the read configuration data for normal startup).

At the same time, in step S305, the normal operation unit 111 of the FPGA_3 reads configuration data for normal startup from the PROM_3 via the serial bus 136, and performs configuration with the read configuration data for normal startup (i.e., writing of the read configuration data for normal startup).

Then, in step S306, the CPU 101 determines whether the configuration of all the FPGAs has been completed. When the CPU 101 determines in step S306 that the configuration of all the FPGAs has been completed (YES in step S306), the information processing apparatus 10 ends a series of operations illustrated in FIG. 3. By contrast, when the CPU 101 determines in step S306 that the configuration of all the FPGAs has not yet been completed (NO in step S306), the CPU 101 executes the operation in step S306 again.

Figure 4:
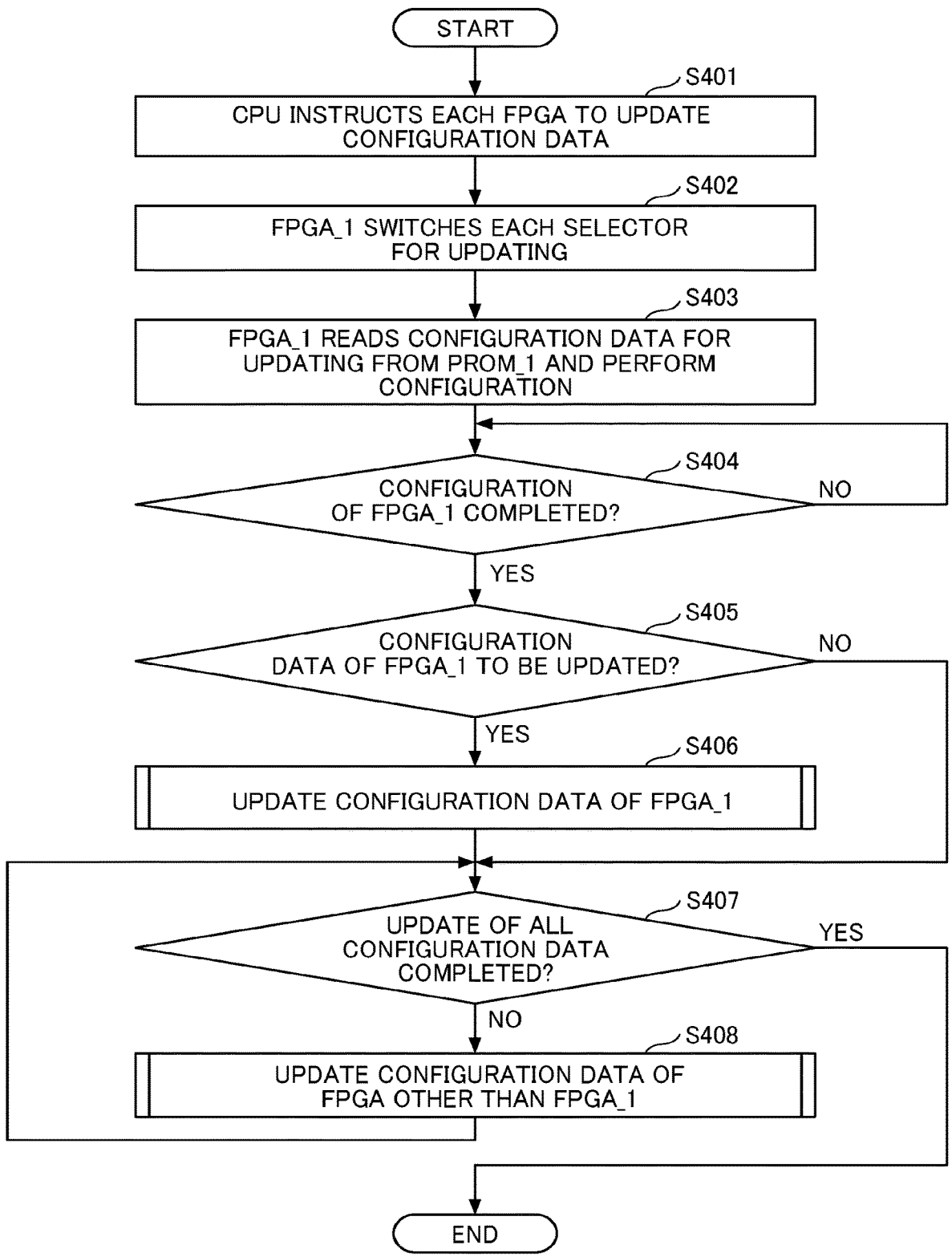
FIG. 4 is a flowchart of an update process that is performed by an information processing apparatus, according to an embodiment of the present disclosure.

Referring now to FIG. 4, a description is given of a procedure taken by the information processing apparatus 10 to carry out an update process.

FIG. 4 is a flowchart of the update process that is performed by the information processing apparatus 10, according to an embodiment of the present disclosure.

Firstly, in step S401, the CPU 101 instructs, via the parallel bus 103, each of the FPGA_1, the FPGA_2, and the FPGA_3 to update configuration data.

Subsequently, in step S402, the FPGA_1 switches each of the selectors 141 to 145 for updating as illustrated in FIG. 8.

As a consequence, the FPGA_1 is connected to the PROM_1 such that the FPGA_1 can communicate with the PROM_1.

Subsequently, in step S403, the update processing unit 112 of the FPGA_1 reads the update configuration data from the PROM_1 via the serial bus 132, and performs configuration with the read update configuration data (i.e., writing of the read update configuration data).

Then, in step S404, the update processing unit 112 of the FPGA_1 determines whether the configuration of the FPGA_1 has been completed.

When the update processing unit 112 of the FPGA_1 determines in step S404 that the configuration of the FPGA_1 has not yet been completed (NO in step S404), the update processing unit 112 of the FPGA_1 executes the operation in step S404 again.

By contrast, when the update processing unit 112 of the FPGA_1 determines in step S404 that the configuration of the FPGA_1 has been completed (YES in step S404), in step S405, the update processing unit 112 of the FPGA_1 determines whether the configuration data of the FPGA_1 is to be updated.

When the update processing unit 112 of the FPGA_1 determines in step S405 that the configuration data of the FPGA_1 is to be updated (YES in step S405), in step S406, the information processing apparatus 10 updates the configuration data of the FPGA_1. The information processing apparatus 10 then advances the process to step S407. Note that a detailed procedure for updating the configuration data of the FPGA_1 will be described later with reference to FIG. 5.

By contrast, when the update processing unit 112 of the FPGA_1 determines in step S405 that the configuration data of the FPGA_1 is not to be updated (NO in step S405), the information processing apparatus 10 advances the process to step S407.

In step S407, the update processing unit 112 of the FPGA_1 determines whether the update of all the configuration data has been completed.

When the update processing unit 112 of the FPGA_1 determines in step S407 that the update of all the configuration data has not yet been completed (NO in step S407), in step S408, the information processing apparatus 10 updates the configuration data of another FPGA other than the FPGA_1 as the update of the configuration data of the FPGA other than the FPGA_1 has not yet been completed. Then, the information processing apparatus 10 returns the process to step S407. Note that a detailed procedure for updating the configuration data of another FPGA other than the FPGA_1 will be described later with reference to FIG. 6.

By contrast, when the update processing unit 112 of the FPGA_1 determines in step S407 that the update of all the configuration data has been completed (YES in step S407), the information processing apparatus 10 ends a series of operations illustrated in FIG. 4.

Figure 5:
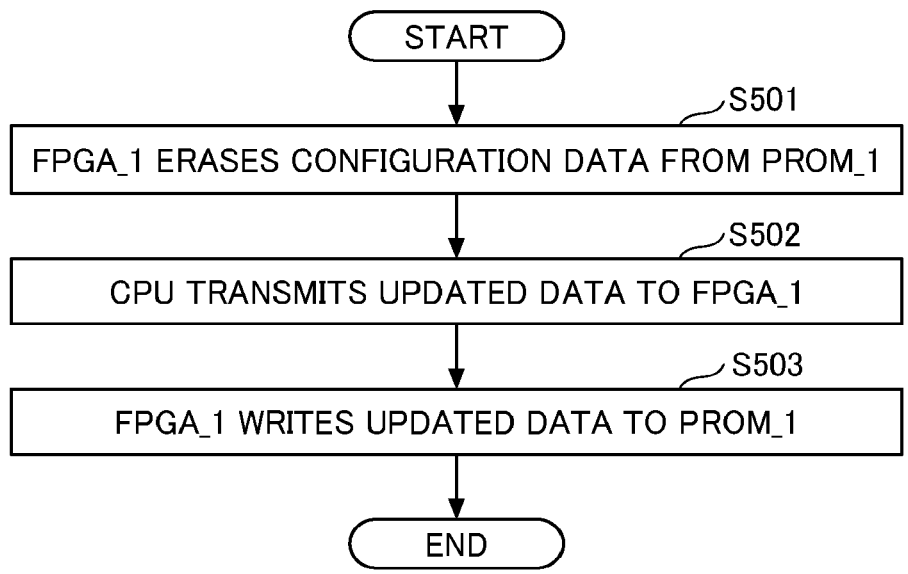
FIG. 5 is a flowchart of a process that is performed by an update processing unit to update the configuration data of a first field programmable gate array (FPGA), according to an embodiment of the present disclosure.

Referring now to FIG. 5, a description is given of a procedure for updating the configuration data of the FPGA_1.

FIG. 5 is a flowchart of a process that is performed by the information processing apparatus 10 to update the configuration data of the FPGA_1, according to an embodiment of the present disclosure.

Firstly, in step S501, the FPGA_1 erases the configuration data of the FPGA_1 stored in the PROM_1. In other words, in step S501, the FPGA_1 erases the configuration data of the FPGA_1 from the PROM_1.

Subsequently, in step S502, the CPU 101 transmits updated data of the configuration data of the FPGA_1 to the FPGA_1.

Subsequently, in step S503, the FPGA_1 writes the updated data of the configuration data of the FPGA_1 to the PROM_1. Then, the information processing apparatus 10 ends a series of operations illustrated in FIG. 5.

Figure 6:
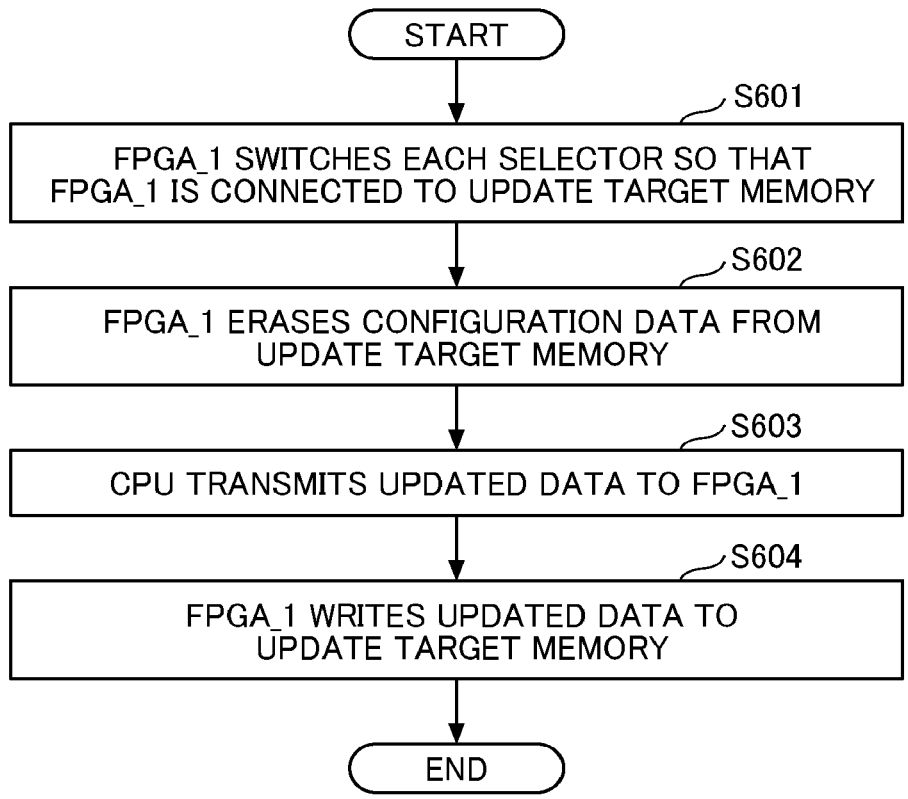
FIG. 6 is a flowchart of a process that is performed by an update processing unit to update the configuration data of another FPGA, according to an embodiment of the present disclosure.

Referring now to FIG. 6, a description is given of a procedure for updating the configuration data of another FPGA.

FIG. 6 is a flowchart of a process that is performed by the information processing apparatus 10 to update the configuration data of another FPGA, according to an embodiment of the present disclosure.

Firstly, in step S601, the FPGA_1 switches each of the selectors 141 to 145 as illustrated in FIG. 9 or 10 to update the configuration data of an FPGA to be updated (hereinafter, such an FPGA to be updated may be referred to as an update target FPGA). Specifically, the update target FPGA is the FPGA_2 or the FPGA_3, in the present embodiment. As a consequence, the FPGA_1 is connected to a memory to be updated (hereinafter, such a memory to be updated may be referred to as an update target memory) such that the FPGA_1 can communicate with the update target memory. Specifically, the update target memory is the PROM_2 or the PROM_3, in the present embodiment. Subsequently, in step S602, the FPGA_1 erases the configuration data of the update target FPGA (i.e., the FPGA_2 or the FPGA_3) stored in the update target memory (i.e., the PROM_2 or the PROM_3). In other words, in step S602, the FPGA_1 erases the configuration data of the update target FPGA (i.e., the FPGA_2 or the FPGA_3) from the update target memory (i.e., the PROM_2 or the PROM_3).

Subsequently, in step S603, the CPU 101 transmits updated data of the configuration data of the update target FPGA (i.e., the FPGA_2 or the FPGA_3) to the FPGA_1.

Subsequently, in step S604, the FPGA_1 writes the updated data of the configuration data of the update target FPGA (i.e., the FPGA_2 or the FPGA_3) to the update target memory (i.e., the PROM_2 or the PROM_3). Then, the information processing apparatus 10 ends a series of operations illustrated in FIG. 6.

Referring now to FIGS. 7 to 10, a description is given of states of the selectors 141 to 145.

Initially with reference to FIG. 7, a description is given of the states of the selectors 141 to 145 upon normal startup.

FIG. 7 is a diagram illustrating the states of the selectors 141 to 145 upon normal startup, according to an embodiment of the present disclosure.

As illustrated in FIG. 7, upon normal startup, each of the selectors 141, 142, and 143 is switched to the "connected" state. As a consequence, the FPGA_1, the FPGA_2, and the FPGA_3 are connected to the PROM_1, the PROM_2, and the PROM_3, respectively, such that the FPGA_1, the FPGA_2, and the FPGA_3 can communicate with the PROM_1, the PROM_2, and the PROM_3, respectively. Accordingly, the FPGA_1, the FPGA-2, and the FPGA-3 read the configuration data for normal startup from the PROM_1, the PROM-2, and the PROM-3, respectively.

Referring now to FIG. 8, a description is given of the states of the selectors 141 to 145 when the configuration data of the FPGA_1 is to be updated.

FIG. 8 is a diagram illustrating the states of the selectors 141 to 145 when the configuration data of the FPGA_1 is to be updated, according to an embodiment of the present disclosure.

As illustrated in FIG. 8, when the configuration data of the FPGA_1 is to be updated, at least the selector 141 is switched to the "connected" state. As a consequence, the FPGA_1 is connected to the PROM_1 via the serial buses 131 and 132 such that the FPGA_1 can communicate with the PROM_1. Accordingly, the update processing unit 112 of the FPGA_1 updates the configuration data for the FPGA_1 stored in the PROM_1.

Referring now to FIG. 9, a description is given of the states of the selectors 141 to 145 when the configuration data of the FPGA_2 is to be updated.

FIG. 9 is a diagram illustrating the states of the selectors 141 to 145 when the configuration data of the FPGA_2 is to be updated, according to an embodiment of the present disclosure.

As illustrated in FIG. 9, when the configuration data of the FPGA_2 is to be updated, at least the selector 144 is switched to the "connected" state, while the selectors 141, 142, and 145 are switched to the "disconnected" state. As a consequence, the FPGA_1 is connected to the PROM_2 via the serial buses 131 and 132, the serial buses 137 and 138, and the serial buses 133 and 134 such that the FPGA_1 can communicate with the PROM_2. Accordingly, the update processing unit 112 of the FPGA_1 updates the configuration data for the FPGA_2 stored in the PROM_2.

Referring now to FIG. 10, a description is given of the states of the selectors 141 to 145 when the configuration data of the FPGA_3 is to be updated.

FIG. 10 is a diagram illustrating the states of the selectors 141 to 145 when the configuration data of the FPGA_3 is to be updated, according to an embodiment of the present disclosure.

As illustrated in FIG. 9, when the configuration data of the FPGA_3 is to be updated, at least the selector 145 is switched to the "connected" state, while the selectors 141, 143, and 144 are switched to the "disconnected" state. As a consequence, the FPGA_1 is connected to the PROM_3 via the serial buses 131 and 132, the serial buses 139 and 140, and the serial buses 135 and 136 such that the FPGA_1 can communicate with the PROM_3. Accordingly, the update processing unit 112 of the FPGA_1 updates the configuration data for the FPGA_3 stored in the PROM_3.

As described above, according to an embodiment of the present disclosure, the information processing apparatus 10 includes the CPU 101, the FPGAs 110 that are connected to the CPU 101 to communicate with the CPU 101, and the PROMs 120 that are provided in a one-to-one relationship with the FPGAs 110. Each of the PROMs 120 stores the configuration data of a corresponding one of the FPGAs 110. One of the FPGAs 110 includes the update processing unit 112 that updates the configuration data of each of the FPGAs 110 stored in a corresponding one of the PROMs 120.

That is, in the information processing apparatus 10 of the present embodiment, a single FPGA 110 (i.e., the one of the FPGAs 110) includes the update processing unit 112, thus reducing the circuit scale of the FPGAs 110 other than the one of the FPGAs 110.

In the information processing apparatus 10 according to an embodiment of the present disclosure, a single PROM 120 (i.e., one of the PROMs 120 corresponding to the one of the FPGAs 110) stores update configuration data that is used for updating. The update processing unit 112 updates the configuration data of each of the FPGAs 110 stored in a corresponding one of the PROMs 120, in response to the update configuration data stored in the one of the PROMs 120 being written to the one of the FPGAs 110. Accordingly, the present embodiment reduces the memory usage of the PROMs 120 other than the one of the PROMs 120.

According to an embodiment of the present disclosure, the information processing apparatus 10 further includes the selectors 141 to 145 that switch the connection destination of the one of the FPGAs 110 between the PROMs 120. The update processing unit 112 controls the selectors 141 to 145 to switch the connection destination of the one of the FPGAs 110 to one of the PROMs 120, the one of the PROMs 120 corresponding to another one of the FPGAs 110 other than the one of the FPGAs 110, to update the configuration data of the FPGA 110 other than the one of the FPGAs 110 stored in the one of the PROMs 120.

Accordingly, in the information processing apparatus 10 of the present embodiment, the one of the FPGAs 110 updates the configuration data of each of the FPGAs 110 with a simple control of switching the selectors 141 to 145.

According to an embodiment of the present disclosure, the information processing apparatus 10 further includes the serial buses 131 to 136 that connect the FPGAs 110 with the PROMs 120 in a one-to-one relationship. The update processing unit 112 switches the connection destination of at least one of the serial buses 131 to 136, the at least one of the serial buses 131 to 136 being connected to the one of the FPGAs 110, to at least another one of the serial buses 131 to 136 other than the at least one of the serial buses 131 to 136, the at least another one of the serial buses 131 to 136 being connected to one of the PROMs 120, the one of the PROMs 120 corresponding to another one of the FPGAs 110, to switch the connection destination of the one of the FPGAs 110 to the one of the PROMs 120.

With such a configuration, the information processing apparatus 10 of the present embodiment updates the configuration data of each of the FPGAs 110 with the one of the FPGAs 110 by use of the serial buses 131 to 136 provided for the individual FPGAs 110. Accordingly, the information processing apparatus 10 of the present embodiment reduces the number of transmission lines that are added to update the configuration data.

Accordingly, the embodiments prevent an increase in the circuit scale of each of FPGAs related to update of the configuration data of each of the FPGAs.

Although the present disclosure makes reference to specific embodiments, it is to be noted that the present disclosure is not limited to the details of the embodiments described above. Thus, various modifications and enhancements are possible in light of the above teachings, without departing from the scope of the present disclosure. It is therefore to be understood that the present disclosure may be practiced otherwise than as specifically described herein. For example, elements and/or features of different embodiments may be combined with each other and/or substituted for each other within the scope of the present disclosure. The number of constituent elements and their locations, shapes, and so forth are not limited to any of the structure for performing the methodology illustrated in the drawings.

Any one of the above-described operations may be performed in various other ways, for example, in an order different from that described above.

Any of the above-described devices or units can be implemented as a hardware apparatus, such as a special-purpose circuit or device, or as a hardware/software combination, such as a processor executing a software program.

Further, each of the functions of the described embodiments may be implemented by one or more processing circuits or circuitry. Processing circuitry includes a programmed processor, as a processor includes circuitry. A processing circuit also includes devices such as an application-specific integrated circuit (ASIC), digital signal processor (DSP), field programmable gate array (FPGA) and conventional circuit components arranged to perform the recited functions.

Further, as described above, any one of the above-described and other methods of the present disclosure may be embodied in the form of a computer program stored on any kind of storage medium. Examples of storage media include, but are not limited to, floppy disks, hard disks, optical discs, magneto-optical discs, magnetic tapes, nonvolatile memory cards, read only memories (ROMs), etc.

Alternatively, any one of the above-described and other methods of the present disclosure may be implemented by the ASIC, prepared by interconnecting an appropriate network of conventional component circuits or by a combination thereof with one or more conventional general-purpose microprocessors and/or signal processors programmed accordingly.

What is claimed is:

1. An information processing apparatus comprising:
   a central processing unit (CPU);
   a plurality of field-programmable gate arrays (FPGAs) connected to the CPU to communicate with the CPU; and
   a plurality of memories provided in a one-to-one relationship with the plurality of FPGAs,
   each of the plurality of memories to store configuration data of a corresponding one of the plurality of FPGAs,
   one of the plurality of FPGAs being configured to update the configuration data of each of the plurality of FPGAs stored in a corresponding one of the plurality of memories.

2. The information processing apparatus according to claim 1, further comprising a switcher configured to switch a connection destination of the one of the plurality of FPGAs between the plurality of memories,
   wherein the one of the plurality of FPGAs is configured to control the switcher to switch the connection destination of the one of the plurality of FPGAs to one of the plurality of memories, the one of the plurality of memories corresponding to another one of the plurality of FPGAs other than the one of the plurality of FPGAs, to update the configuration data of said another one of the plurality of FPGAs stored in the one of the plurality of memories.

3. The information processing apparatus according to claim 2, further comprising a plurality of serial buses connecting the plurality of FPGAs with the plurality of memories in the one-to-one relationship,
   wherein the one of the plurality of FPGAs is configured to switch a connection destination of at least one of the plurality of serial buses, the at least one of the plurality of serial buses being connected to the one of the plurality of FPGAs, to at least another one of the plurality of serial buses other than the at least one of the plurality of serial buses, the at least another one of the plurality of serial buses being connected to the one of the plurality of memories, to switch the connection destination of the one of the plurality of FPGAs to the one of the plurality of memories.

4. The information processing apparatus according to claim 1,
   wherein one of the plurality of memories corresponding to the one of the plurality of FPGAs is configured to store update configuration data that is used for updating, and
   wherein the one of the plurality of FPGAs is configured to update the configuration data of each of the plurality of FPGAs stored in a corresponding one of the plurality of memories, in response to the update configuration data stored in the one of the plurality of memories being written to the one of the plurality of FPGAs.

5. The information processing apparatus according to claim 1, wherein:
   others of the plurality of FPGAs not including the one of the plurality of FPGAs not being configured to update the configuration data of each of the plurality of FPGAs.

6. A configuration method for an information processing apparatus, the information processing apparatus including a central processing unit (CPU), a plurality of field-programmable gate arrays (FPGAs) connected to the CPU to communicate with the CPU, and a plurality of memories provided in a one-to-one relationship with the plurality of FPGAs, each of the plurality of memories to store configuration data of a corresponding one of the plurality of FPGAs,
   the configuration method comprising updating, with one of the plurality of FPGAs, the configuration data of each of the plurality of FPGAs stored in a corresponding one of the plurality of memories.

7. The method according to claim 6, further comprising:
   switching a connection destination of the one of the plurality of FPGAs between the plurality of memories,
   wherein the one of the plurality of FPGAs performs controlling the switching to switch the connection destination of the one of the plurality of FPGAs to one of the plurality of memories, the one of the plurality of memories corresponding to another one of the plurality of FPGAs other than the one of the plurality of FPGAs, to update the configuration data of said another one of the plurality of FPGAs stored in the one of the plurality of memories.

8. The method according to claim 7, wherein the information processing apparatus further includes a plurality of serial buses configured to connect the plurality of FPGAs with the plurality of memories in the one-to-one relationship,
   wherein the one of the plurality of FPGAs further performs switching a connection destination of at least one of the plurality of serial buses, the at least one of the plurality of serial buses being connected to the one of the plurality of FPGAs, to at least another one of the plurality of serial buses other than the at least one of the plurality of serial buses, the at least another one of the plurality of serial buses being connected to the one of the plurality of memories, to switch the connection destination of the one of the plurality of FPGAs to the one of the plurality of memories.

9. The method according to claim 6, wherein:
   wherein one of the plurality of memories corresponding to the one of the plurality of FPGAs performs storing update configuration data that is used for updating, and
   wherein the one of the plurality of FPGAs performs updating the configuration data of each of the plurality of FPGAs stored in a corresponding one of the plurality of memories, in response to the update configuration data stored in the one of the plurality of memories being written to the one of the plurality of FPGAs.

10. The method according to claim 6, wherein:
    others of the plurality of FPGAs not including the one of the plurality of FPGAs not updating the configuration data of each of the plurality of FPGAs.

* * * * *